United States Patent [19]

Hayakawa

[11] Patent Number: 5,684,824
[45] Date of Patent: Nov. 4, 1997

[54] SEMICONDUCTOR LIGHT EMITTING DEVICE

[75] Inventor: Toshiro Hayakawa, Kanagawa-ken, Japan

[73] Assignee: Fuji Photo Film Co., Ltd., Kanagawa, Japan

[21] Appl. No.: 671,554

[22] Filed: Jun. 27, 1996

Related U.S. Application Data

[62] Division of Ser. No. 502,637, Jul. 14, 1995, Pat. No. 5,608,743.

[30] Foreign Application Priority Data

Jul. 15, 1994 [JP] Japan .................................. 6-163696
Dec. 16, 1994 [JP] Japan .................................. 6-313157

[51] Int. Cl.$^6$ ..................................................... H01S 3/10
[52] U.S. Cl. ........................... 372/103; 372/19; 372/101; 372/102
[58] Field of Search ............................. 372/92, 102, 103, 372/20, 19

[56] References Cited

U.S. PATENT DOCUMENTS 5,392,308  2/1995  Welch et al. .......................... 372/20

OTHER PUBLICATIONS

"Electronics Letters", Jul. 8, 1993, vol. 29, No. 14, pp. 1254–1255.

"Electronics Letters", Mar. 3, 1988, vol. 19, No. 5, pp. 169–171.

"Applied Physics Letter", vol. 60(6), Feb. 10, 1992, pp. 668–670.

*Primary Examiner*—James W. Davie
*Attorney, Agent, or Firm*—Sughrue,Mion,Zinn,Macpeak & Seas, PLLC

[57] ABSTRACT

A semiconductor light emitting device includes a semiconductor light amplifier, a mirror which reflects light emanating from the rear end face of the semiconductor light amplifier to return the light to the rear end face of the semiconductor light amplifier, and a band pass filter which is inserted into the optical path of the light emanating from the rear end face of the semiconductor light amplifier and has a narrow transmission wavelength band.

9 Claims, 5 Drawing Sheets

SEMICONDUCTOR LIGHT EMITTING DEVICE

This is a divisional of application Ser. No. 08/502,637 filed Jul. 14, 1995, now U.S. Pat. No. 5,608,743.

BACKGROUND OF THE INVENTION

1. Field of the Invention

This invention relates to a semiconductor light emitting device, and more particularly to a semiconductor light emitting device which has a semiconductor light amplifier as a light source and controls the output wavelength to a desired value by returning a selected wavelength component of light emanating from the semiconductor light amplifier to the semiconductor light amplifier.

2. Description of the Related Art

There have been made various attempts to obtain a high intensity light beam of a single wavelength using a semiconductor. An example of such a semiconductor light emitting device is disclosed in "ELECTRONICS LETTERS" Vol. 29, No.14, (1993), pp.1254~1255.

As shown in FIG. 12, the semiconductor light emitting device has a semiconductor light amplifier 1 as a light source. Light emanating from the rear end face 1a of the semiconductor light amplifier 1 is collimated by a lens 2 and then caused to impinge upon a reflection diffraction grating 3. With this arrangement, light component 4 having a wavelength selected by the diffraction grating 3 is returned to the semiconductor light amplifier 1 and accordingly the wavelength of light 4F emanating from the front end face 1b of the semiconductor light amplifier 1 is locked to a single wavelength, whereby a high quality and high intensity light beam of not less than 1.5 W near the diffraction limit can be obtained.

Further in the semiconductor light emitting device, the output wavelength can be changed within a certain range by changing the angle of the diffraction grating 3 so that the angle of incidence at the diffraction grating 3 changes.

In the conventional semiconductor light emitting device where the output wavelength is selected by use of an external optical system, the phenomenon that the angle of diffraction at the diffraction grating changes with wavelength is utilized and accordingly a spatial aperture for cutting light beams which travel deviating from the predetermined optical path after reflection at the diffraction grating is required for selection of the wavelength. For this purpose, as the semiconductor light amplifier 1, a tapered stripe amplifier where the stripe width Wi on the side of the external optical system is narrowed, for instance, to 4 μm has been conventionally used as shown in FIG. 12 and the narrow stripe is used as an effective spatial aperture. When the stripe Wi is narrow, the transverse mode becomes optically single and since the stable mode is coupled with the diffraction grating, the high output light beam amplified by the tapered stripe amplifier can be of a high quality close to the diffraction limit.

However such a limit in the stripe width makes it difficult to meet a high output requirement.

Further in the conventional semiconductor light emitting device, the angle of the diffraction grating must be set with a high accuracy in order to obtain a desired output wavelength, which is very troublesome and difficult. As the numerical aperture HA of the lens 2 is increased in order to increase the coupling efficiency of the light component emanating from the semiconductor light amplifier 1 with the diffraction grating 3, the depth of focus reduces and a higher accuracy is required in alignment of the optical system. Accordingly shift in relative positions between the optical parts due to change with time or vibration can results in deterioration in performance and/or instability of light output.

Further the conventional semiconductor light amplifier is also disadvantageous in that the oscillation mode becomes instable due to coupling of a plurality of transverse mode outputs if the stripe width Wi on the side of the diffraction grating is not sufficiently narrow.

Further the diffraction grating is generally very expensive and it has been difficult to manufacture the conventional semiconductor light emitting device at a low cost.

SUMMARY OF THE INVENTION

In view of a foregoing observations and description, the primary object of the present invention is to provide a semiconductor light emitting device whose output wavelength can be selected by an external optical system, which can be manufactured at low cost and in which the degree of freedom of selecting the semiconductor light amplifier is high and adjustment of the parts is easy.

Another object of the present invention is to provide a semiconductor light emitting device in which the accuracy requirement to the alignment of the optical system is relatively weak and accordingly deterioration in performance and/or instability of light output due to shift in relative positions between the optical parts can be prevented.

Still another object of the present invention is to provide a semiconductor light emitting device which has a single transverse mode oscillation, whereby a stable oscillation mode can be obtained.

The semiconductor light emitting device in accordance with a first aspect of the present invention is characterized in that the output wavelength is selected by a band pass filter instead of the diffraction grating described above.

That is, in accordance with the first aspect of the present invention, there is provided a semiconductor light emitting device comprising a semiconductor light amplifier, a mirror which reflects light emanating from one end face of the semiconductor light amplifier to return the light to said one end face of the semiconductor light amplifier, and a band pass filter which is inserted into the optical path of the light emanating from said one end face of the semiconductor light amplifier and has a narrow transmission wavelength band.

With this arrangement, light emanating from one end of the semiconductor light amplifier is subjected to wavelength selection by the band pass filter which has a narrow transmission wavelength band and a light component of the selected wavelength is only returned to the semiconductor light amplifier. Accordingly the output wavelength of the semiconductor light amplifier is controlled to a single wavelength as in the conventional semiconductor light emitting device where the diffraction grating is employed.

In the semiconductor light emitting device, the wavelength selection is effected by only the band pass filter, no spatial aperture is required. Accordingly the semiconductor light amplifier need not have a narrow stripe width on the side of the external optical system and various semiconductor light amplifiers can be used as well as those of high output types.

Further the band pass filter is less expensive than the diffraction grating and the semiconductor light emitting device in accordance with the first aspect can be manufactured at lower cost.

Further since the band pass filter effects wavelength selection not by angular dispersion unlike the diffraction grating, the angular position of the band pass filter need not be so accurate and accordingly, adjustment of the parts is easy in the semiconductor light emitting device in accordance with the first aspect.

Though in the case of a multi-layered interference filter, which is one of the band pass filters, the transmission wavelength somewhat changes with change in the angle of the filter relative to the optical path, the angle of the filter relative to the optical path does not essentially governs the transmission wavelength.

In accordance with a second aspect of the present invention, there is provided a semiconductor light emitting device comprising a semiconductor light amplifier, a diffraction grating which reflects and diffracts light emanating from one end face of the semiconductor light amplifier to return the light to said one end face of the semiconductor light amplifier, and a focusing lens which focuses the light emanating from said one end face of the semiconductor light amplifier and images a light emission near field pattern of said one end face of the semiconductor light amplifier on the diffraction grating.

When the light emanating from said one end face of the semiconductor light amplifier is focused and a light emission near field pattern of said one end face of the semiconductor light amplifier is imaged on the diffraction grating, the accuracy requirement to the alignment of the optical system becomes weak and as a result deterioration in performance and/or instability of light output due to shift in relative positions between the optical parts can be prevented.

Further when the accuracy requirement to the alignment of the optical system is weak, alignment during manufacture of the semiconductor light emitting device is facilitated.

In one embodiment of the second aspect, the diffraction grating is shaped to be selectively coupled with a particular transverse mode component of the light emanating from said one end face of the semiconductor light amplifier.

With this arrangement, the transverse mode is singled and the oscillation mode is stabilized.

In another embodiment of the second aspect, a mask which interrupts a part of the light emanating from said one end face of the semiconductor light amplifier and permits only a particular transverse mode component of the light to enter the diffraction grating is provided between the diffraction grating and the semiconductor light amplifier.

Also with this arrangement, the transverse mode is singled and the oscillation mode is stabilized.

In accordance with a third aspect of the present invention, there is provided a semiconductor light emitting device comprising a semiconductor light amplifier, a mirror which reflects light emanating from one end face of the semiconductor light amplifier to return the light to said one end face of the semiconductor light amplifier, a band pass filter which is inserted into the optical path of the light emanating from said one end face of the semiconductor light amplifier and has a narrow transmission wavelength band, and a focusing lens which focuses the light emanating from said one end face of the semiconductor light amplifier and images a light emission near field pattern of said one end face of the semiconductor light amplifier on the mirror.

When the light emanating from said one end face of the semiconductor light amplifier is focused and a light emission near field pattern of said one end face of the semiconductor light amplifier is imaged on the mirror, the accuracy requirement to the alignment of the optical system becomes weak and as a result deterioration in performance and/or instability of light output due to shift in relative positions between the optical parts can be prevented.

Further when the accuracy requirement to the alignment of the optical system is weak, alignment during manufacture of the semiconductor light emitting device is facilitated.

In one embodiment of the third aspect, the mirror is shaped to selectively reflect a particular transverse mode component of the light emanating from said one end face of the semiconductor light amplifier.

With this arrangement, the transverse mode is singled and the oscillation mode is stabilized.

In another embodiment of the third aspect, a mask which interrupts a part of the light emanating from said one end face of the semiconductor light amplifier and permits only a particular transverse mode component of the light to impinge upon the mirror is provided between the mirror and the semiconductor light amplifier.

Also with this arrangement, the transverse mode is singled and the oscillation mode is stabilized.

DESCRIPTION OF THE PREFERRED EMBODIMENTS

Figure 1:
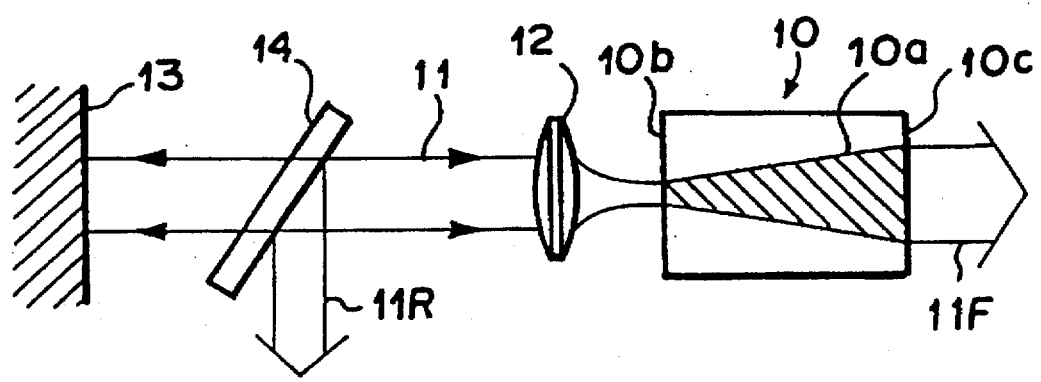
FIG. 1 is a schematic plan view showing a semiconductor light emitting device in accordance with a first embodiment of the present invention.

In FIG. 1, a semiconductor light emitting device in accordance with a first embodiment of the present invention comprises a semiconductor light amplifier 10 having a tapered stripe 10a, a collimator lens 12 which collimates a light beam 11 emanating from a rear end face 10b of the semiconductor light amplifier 10, a mirror 13, for instance, of aluminum which reflects the light beam 11 to return the same optical path and an interference filter 14 which is inserted into the optical path of the light beam 11 between the mirror 13 and the collimator lens 12.

The semiconductor light amplifier 10 is 200 µm in width Wi (FIG. 2) of the tapered stripe 10a as measured on the rear end face 10b, 500 µm in width Wo of the tapered stripe 10a as measured on the front end face 10c, and 1.5 mm in length L. For example, one obtained by forming an n-GaAs buffer layer (doped with $1\times10^{18}$ cm$^{-3}$ Si, 0.5 µm thick), an n-Al$_{0.5}$Ga$_{0.5}$As cladding layer (doped with $1\times10^{18}$ cm$^{-3}$ Si, 2.5 µm thick), an n-Al$_{0.25}$Ga$_{0.75}$As light guide layer (undoped, 0.05 µm thick), an n-Al$_{0.05}$Ga$_{0.95}$As quantum well layer (undoped, 8 nm thick), an n-Al$_{0.25}$Ga$_{0.75}$As light guide layer (undoped, 0.05 µm thick), a p-Al$_{0.5}$Ga$_{0.5}$As cladding layer (doped with $1\times10^{18}$ cm$^{-3}$ Zn, 2 µm thick), and a p-GaAs cap layer (doped with $5\times10^{18}$ cm$^{-3}$ Zn, 0.3 µm thick) on a n-GaAs substrate (doped with $1\times10^{18}$ cm$^{-3}$ Si) by a vacuum MOCVD method may be used.

The tapered stripe 10a may be formed, for instance, in the following manner. That is, a SiO$_2$ film is formed on the cap layer of the semiconductor light amplifier and the SiO$_2$ film in a tapered region where the stripe is to be formed is removed by photolithography and etching. Then an ohmic electrode is formed of Ti/Pt/Au on the p-side and an ohmic electrode is formed of AuGe/Ni/Au on the n-side.

The rear and front end faces 10b and 10c of the semiconductor light amplifier 10 are applied with a low reflectivity coating so that the reflectivity as viewed from inside is not higher than 0.5%. That is, the semiconductor light amplifier 10 is a traveling wave amplifier.

Figure 3:
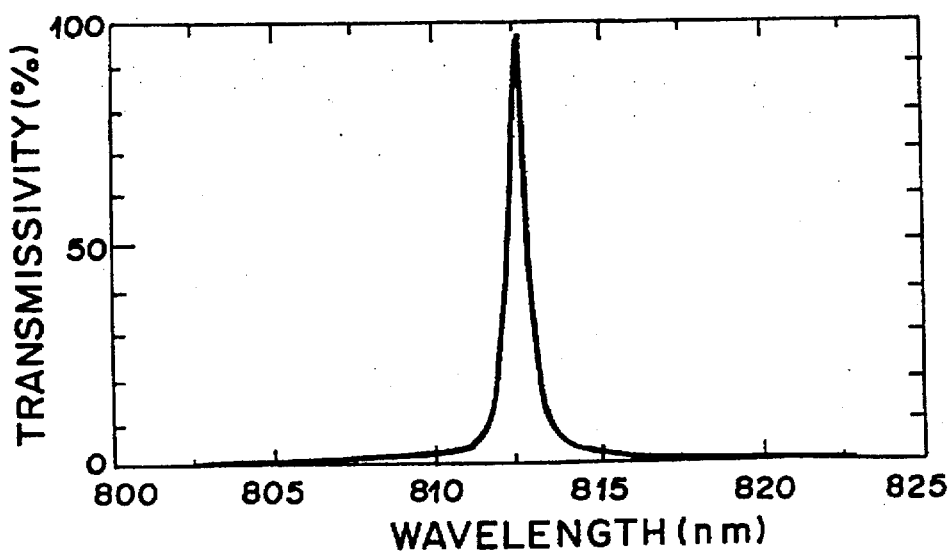
FIG. 3 is a graph showing the spectral transmissivity properties of the band pass filter employed in the first embodiment.

The interference filter 14 comprises a plurality of dielectric layers formed on an optical glass plate and the transmission wavelength band of the interference filter 14 is extremely narrow as shown in FIG. 3 (peak transmission wavelength: 812.5 nm). The interference filter 14 is inclined by 5° to the optical path of the light beam 11 so that the reflected light beam 11R does not directly return to the semiconductor light amplifier 10. The angle of inclination of the interference filter 14 need not be limited to 5° so long as the reflected light beam 11R does not return to the semiconductor light amplifier 10.

In the arrangement described above, the light beam 11 emanating from the rear end face 10b of the semiconductor light amplifier 10 originally has wavelengths in a wavelength band of 800 to 820 nm. However the light beam passing through the interference filter 14 substantially has a single wavelength of 812.5 nm. Accordingly the wavelength of the output light of the semiconductor light amplifier 10 is singled to 812.5 nm. The light of this wavelength is amplified during traveling forward (rightward in FIG. 1) and emanates from the front end face 10c of the semiconductor light amplifier 10. In this particular embodiment, the power of the output light 11F can be as high as 1 W or more.

Since the transmission wavelength of the interference filter 14 continuously shifts when the angle of the interference filter 14 to the optical path of the light beam 11 is changed, the output wavelength of the semiconductor light amplifier 10 can be changed by changing the angle of inclination of the interference filter 14.

Figure 4:
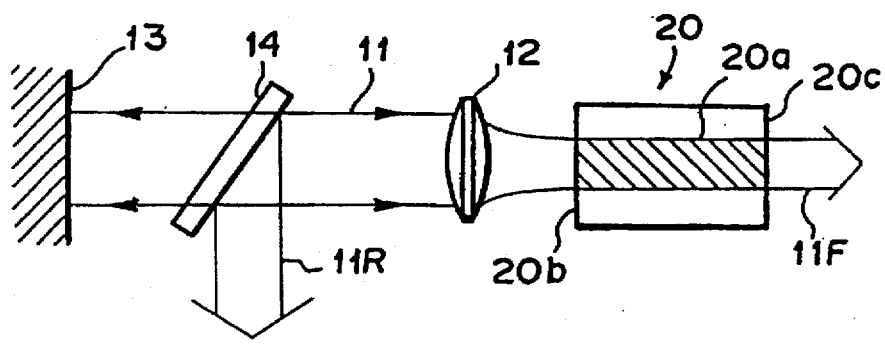
FIG. 4 is a schematic plan view showing a modification of the first embodiment of the present invention.

Since the wavelength selection is effected not by a diffraction grating in the embodiment described above, the semiconductor light amplifier 10 need not have a narrow stripe width as the rear end face 10b. In a modification shown in FIG. 4, a semiconductor light amplifier 20 having a linear stripe 20a is employed. In FIG. 4, the elements analogous to those shown in FIG. 1 are given the same reference numerals and will not be described here.

For example, the semiconductor light amplifier 20 is 1.5 mm in length and the width of the stripe 20a is 100 µm over the entire length thereof. Rear and front end faces 20b and 20c are applied with a low reflectivity coating similar to that employed in the first embodiment.

Also in this modification, a single wavelength output of not lower than 1 W can be obtained.

Besides the gain waveguide type semiconductor light amplifiers described above, a refractive index waveguide type semiconductor light amplifier where a difference in refractive index is formed between each side of the stripe and the outer portion thereof may be employed.

Figure 5:
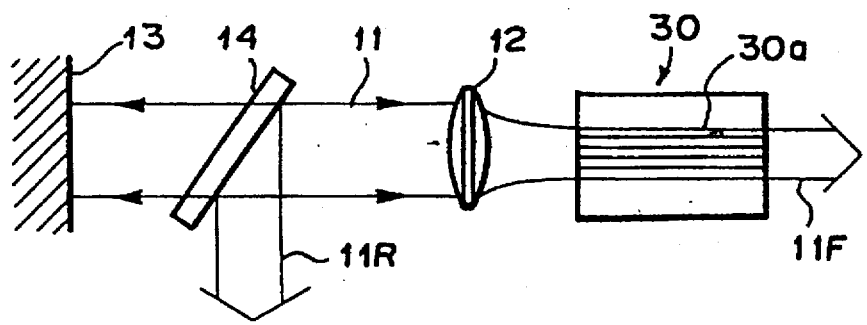
FIG. 5 is a schematic plan view showing another modification of the first embodiment of the present invention.

In another modification shown in FIG. 5, a phase-locked array type semiconductor light amplifier 30 is employed. Various types of phase-locked array type semiconductor light amplifiers are known as described, for instance, in "ELECTRONICS LETTERS" Vol. 19, 1982, p.169 and "APPLIED PHYSICS LETTER" Vol. 60, 1992, p.668 and any of the known phase-locked array type semiconductor light amplifiers can be employed as the phase-locked array type semiconductor light amplifier 30.

Figure 6:
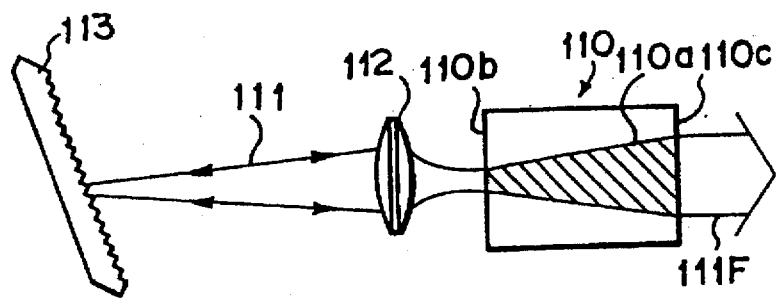
FIG. 6 is a schematic plan view showing a semiconductor light emitting device in accordance with a second embodiment of the present invention.

In FIG. 6, a semiconductor light emitting device in accordance with a second embodiment of the present invention comprises a semiconductor light amplifier 110 having a tapered stripe 110a, a focusing lens 112 which focuses a light beam 111 emanating from a rear end face 110b of the semiconductor light amplifier 110, and a diffraction grating 113 with blaze which diffracts and reflects the focused light beam 111 to return the same optical path.

Figure 2:
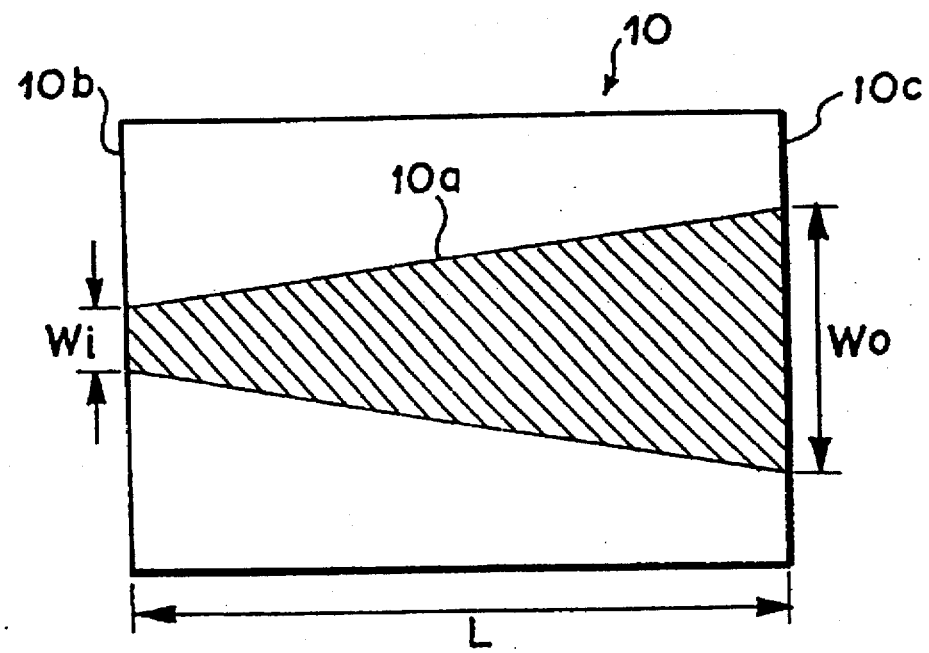
FIG. 2 is an enlarged plan view of the semiconductor light amplifier employed in the first embodiment.

The semiconductor light amplifier 110 is substantially the same as the semiconductor light amplifier 10 shown in FIG. 2 except that the semiconductor light amplifier 110 employed in this embodiment is 4 µm in width Wi of the tapered stripe 110a as measured on the rear end face 110b, 360 µm in width Wo of the tapered stripe 110a as measured on the front end face 110c, and 1.5 mm in length L.

The tapered stripe 110a may be formed, for instance, in the following manner. That is, a SiO$_2$ film is formed on the cap layer of the semiconductor light amplifier and the SiO$_2$ film in a tapered region where the stripe is to be formed is removed by photolithography and etching. Then an ohmic electrode is formed of AuZn/Au on the p-side and an ohmic electrode is formed of AuGe/Ni/Au on the n-side.

Also in this embodiment, the rear and front end faces 110b and 110c of the semiconductor light amplifier 110 are applied with a low reflectivity coating so that the reflectivity as viewed from inside is not higher than 0.5%. That is, the semiconductor light amplifier 110 is a traveling wave amplifier.

The blaze angle of the diffraction grating 113 is 19.7° and the number of lines of the diffraction grating 113 is 830.8/mm. The focusing lens 112 is 0.6 in the numerical aperture NA.

In the arrangement described above, the light beam 111 emanating from the rear end face 110b of the semiconductor light amplifier 110 originally has wavelengths in a wavelength band of 800 to 820 nm. However the light which is reflected by the diffraction grating 113 and returns to the semiconductor light amplifier 110 has a single wavelength in the wavelength band. Accordingly the wavelength of the output light of the semiconductor light amplifier 110 is singled to the wavelength. The light of this wavelength is amplified during traveling forward (rightward in FIG. 6) and emanates from the front end face 110c of the semiconductor light amplifier 110. In this particular embodiment, the power of the output light 111F can be as high as 0.5 W or more.

When the angle of inclination of the diffraction grating 113 relative to the optical path of the light beam 111 changes, a light component reflected at a different angle by the diffraction grating 113 comes to return to the semiconductor light amplifier 110, that is, the wavelength of the light returning to the semiconductor light amplifier 110 changes. Accordingly, the output wavelength of the semiconductor light amplifier 110 can be changed by changing the angle of inclination of the diffraction grating 113.

Figure 7:
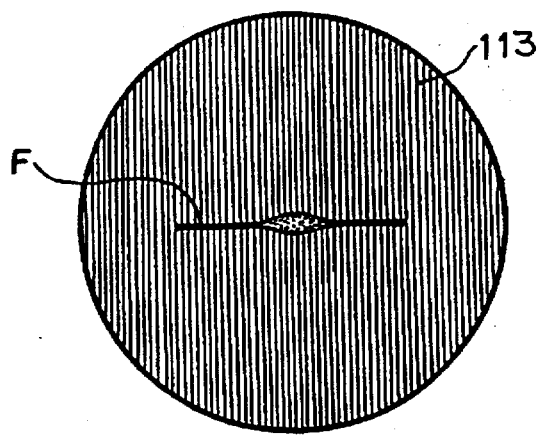
FIG. 7 is a schematic view showing a pattern of light emanating from the rear end face of the semiconductor light amplifier projected on the diffraction grating in the second embodiment.

In this embodiment, the distance between the rear end face 110b of the semiconductor light amplifier 110 and the focusing lens 112 is set slightly longer than the focal length of the focusing lens 112 and the diffraction grating 113 is positioned so that the light beam 111 is focused on the diffraction grating 113 and a light emission near field pattern F of the rear end face 110a of the semiconductor light amplifier 110 is imaged on the diffraction grating 113 as shown in FIG. 7. The diffraction grating 113 is sized so that the whole light emission near field pattern F of the rear end face 110a can be imaged on the diffraction grating 113.

Figure 8:
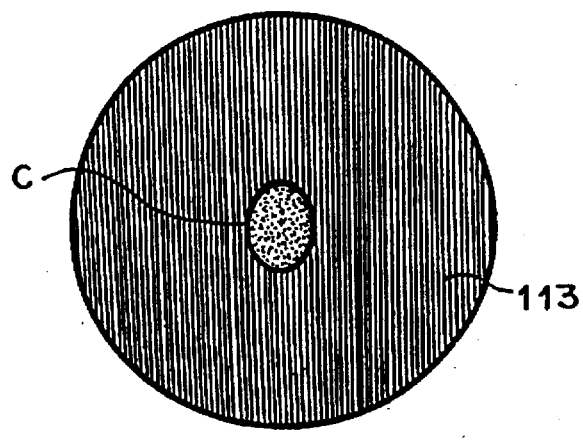
FIG. 8 is a schematic view showing a pattern of light emanating from the rear end face of the semiconductor light amplifier projected on the diffraction grating in the semiconductor light emitting device in accordance with the prior art.
Figure 12:
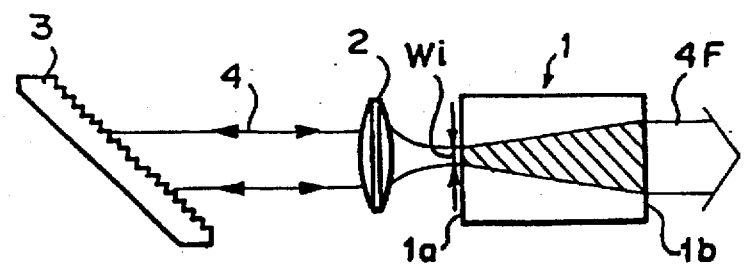
FIG. 12 is a schematic plan view showing a semiconductor light emitting device in accordance with a prior art.

When the focusing lens 112 is moved toward the rear end face 110b from the state described above to a position where the rear end face 110b is near the focal point of the focusing lens 112, the light beam 111 comes to enter the diffraction grating 113 in a collimated state as in the conventional semiconductor light emitting device shown in FIG. 12. In this state, collimated light C is observed on the diffraction grating 113 as shown in FIG. 8.

Figure 9:
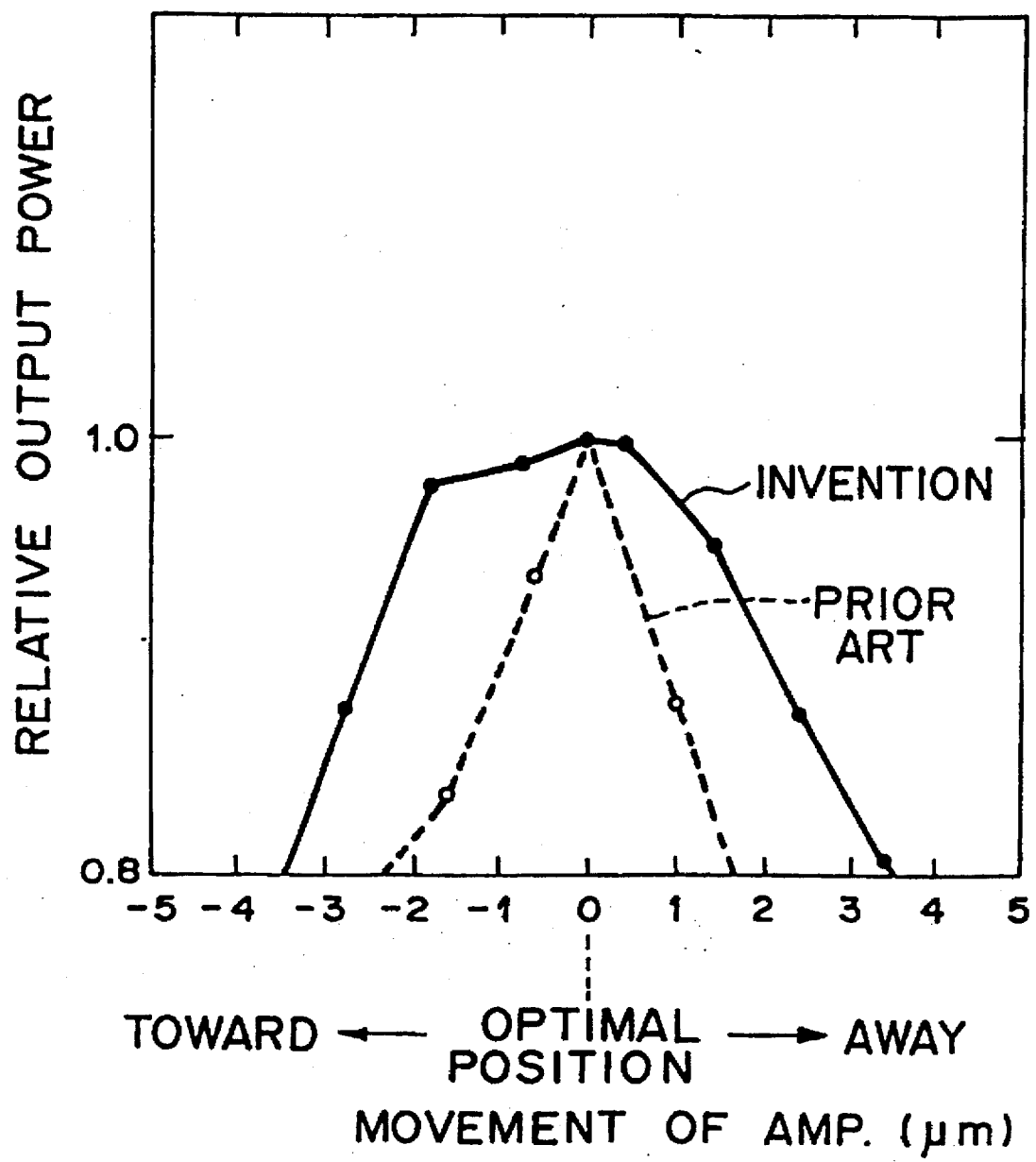
FIG. 9 is a graph showing the change in the power of the output light of the semiconductor light emitting device of the second embodiment with change in the distance between the focusing lens and the semiconductor light amplifier in comparison with that of the semiconductor light emitting device of the prior art.

From a state where a light emission near field pattern F of the rear end face 110a of the semiconductor light amplifier 110 was imaged on the diffraction grating 113 as shown in FIG. 7, the semiconductor light amplifier 110 was moved back and forth (toward and away from the focusing lens 112 and the change in the power of the output light 111F was measured. At the same time, from a state where collimated light C was observed on the diffraction grating 113 as shown in FIG. 8, the semiconductor light amplifier 110 was moved back and forth (toward and away from the focusing lens 112 and the change in the power of the output light 111F was measured. The result is shown in FIG. 9. In FIG. 9, the power of the output light 111F is shown in the terms of proportion to the maximum value (=1).

As can be understood from FIG. 9, in the case where the light beam 111 enters the diffraction grating 113 in a collimated state as in the conventional semiconductor light emitting device, the power sharply drops as the semiconductor light amplifier 110 is slightly shifted from the optimal position where the power is maximized. By contrast, in the case of the optical arrangement of this embodiment where a light emission near field pattern F of the rear end face 110a of the semiconductor light amplifier 110 is imaged on the diffraction grating 113, the power only slightly drops even if the semiconductor light amplifier 110 is shifted from the optimal position. The change in the power due to shift of the semiconductor light amplifier 110 is smaller by about one order of magnitude in the semiconductor light emitting device of this embodiment than in the conventional device.

Figure 10:
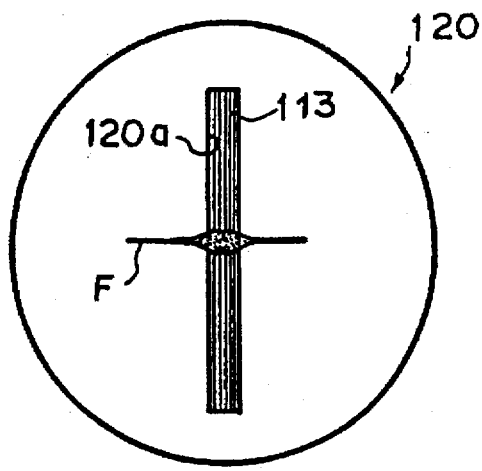
FIG. 10 is a plan view showing the mask employed in a third embodiment of the present invention.

FIG. 10 shows a third embodiment of the present invention. The semiconductor light emitting device of the third embodiment is substantially the same as that of the second embodiment except that a mask 120 having a slit 120a as shown in FIG. 10 is mounted on the surface of the diffraction grating 113 facing the semiconductor light amplifier 110. The mask 120 is for partly interrupting the light beam 111 so that the diffraction grating 113 acts on only a part of the middle portion (as viewed in the longitudinal direction) of the light emission near field pattern F.

The mask 120 interrupts a higher mode part of the light beam 111 and permits only a fundamental transverse mode part of the light beam 111 to impinge upon the diffraction grating 113, thereby further stabilizing the oscillation mode. For example, when the stripe width Wi is set wide, e.g., 6 µm, so that a higher transverse mode is permitted in a semiconductor light amplifier 110 having a refractive index waveguide type structure near the rear end face 110b the oscillation spectrum becomes a multiple mode, which is considered due to a multiple transverse mode, if there is not the mask 120. By providing the mask 120 whose slit width is about 1 mm, the oscillation spectrum can be singled.

In the case where a gain waveguide type semiconductor light amplifier 110 is employed as in the second embodiment described above, the oscillation spectrum sometimes becomes a multiple mode since the effective stripe width Wi becomes up to 10 µm or so due to spread of an electric current. Also in such a case, the oscillation spectrum can be singled by providing the mask 120 whose slit width is about 1 mm.

The mask 120 may be formed by forming a slit 120a in a sheet material such as of paper or fabric or a plate material such as of metal or may be formed by coating resin or the like on the diffraction grating 113. The mask 120 of such a sheet material or a plate material may be positioned either in a close contact with the diffraction grating 113 or slightly spaced from the same.

Instead of the mask 120 having the slit 120a, a mask the light transmissivity of which is maximum in the area corresponding to the slit 120a and is gradually reduced outward in the direction of Width of the area may be used.

Further an optical substrate on which a diffraction grating is formed only the area corresponding to the slit 120a or an optical substrate the light transmissivity of which is maximum in the area corresponding to the slit 120a and is gradually reduced outward in the direction of width of the area may be used instead of using the mask 120 or together with the mask 120.

Figure 11:
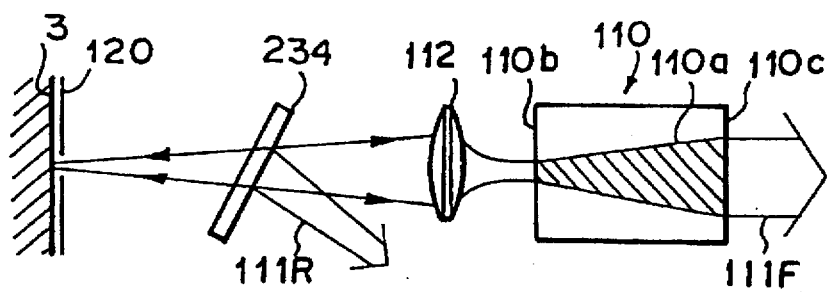
FIG. 11 is a schematic plan view showing a semiconductor light emitting device in accordance with a fourth embodiment of the present invention.

FIG. 11 shows a fourth embodiment of the present invention.

In FIG. 11, the parts analogous to those shown in FIG. 6 are given the same reference numerals and will not be described in detail here. That is, the semiconductor light emitting device in accordance with the fourth embodiment of the present invention comprises a semiconductor light amplifier 110 having a tapered stripe 110a, a focusing lens 112 which focuses a light beam 111 emanating from a rear end face 110b of the semiconductor light amplifier 110, a high reflectivity mirror 213, for instance, of aluminum which reflects the light beam 111 to return the same optical path and an interference filter 234 which is inserted into the optical path of the light beam 111 between the mirror 213 and the focusing lens 112.

The interference filter 234 comprises a plurality of dielectric layers formed on an optical glass plate and the transmission wavelength band of the interference filter 234 is extremely narrow (peak transmission wavelength: 812.5 nm). The interference filter 234 is inclined to the optical path of the light beam 111 so that the reflected light beam 111R does not directly return to the semiconductor light amplifier 110.

In the arrangement described above, the light beam 111 emanating from the rear end face 110b of the semiconductor light amplifier 110 originally has wavelengths in a wavelength band of 800 to 820 nm. However the light beam passing through the interference filter 234 substantially has a single wavelength in the wavelength band. Accordingly the wavelength of the output light of the semiconductor light amplifier 110 is singled. The light of this wavelength 11F is amplified during traveling forward and emanates from the front end face 110c of the semiconductor light amplifier 110. Since the transmission wavelength of the interference filter 234 continuously shifts when the angle of the interference filter 234 to the optical path of the light beam 111 is changed, the output wavelength of the semiconductor light amplifier 110 can be changed by changing the angle of inclination of the interference filter 234.

In this embodiment, a light emission near field pattern F of the rear end face 110a of the semiconductor light amplifier 110 is imaged on the mirror 213. The mirror 213 is sized so that the whole light emission near field pattern F of the rear end face 110a can be imaged on the mirror 213.

Also in this embodiment, the accuracy requirement to the alignment of the optical system becomes weak and as a result deterioration in performance and/or instability of light output due to shift in relative positions between the optical parts can be prevented.

A mask 120 having a slit 120a similar to that shown in FIG. 10 is mounted on the surface of the mirror 213. The mask 120 interrupts a higher mode part of the light beam 111 and permits only a fundamental transverse mode part of the light beam 111 to impinge upon the diffraction grating 113, thereby further stabilizing the oscillation mode.

When an optical substrate on which a mirror is formed only the area corresponding to the slit 120a is used as the mirror 213, the same effect can be obtained without the mask 120. Of course, such an optical substrate may be provided with the mask 120.

Various types of phase-locked array type semiconductor light amplifiers are known as described, for instance, in "ELECTRONICS LETTERS" Vol. 19, 1982, p.169 and "APPLIED PHYSICS LETTER" Vol. 60, 1992, p.668 and any of the known phase-locked array type semiconductor light amplifiers can be employed as the semiconductor light amplifier in the second to fourth embodiments.

What is claimed is:

1. A semiconductor light emitting device comprising
a semiconductor light amplifier,
a diffraction grating which reflects and diffracts light emanating from one end face of the semiconductor light amplifier to return the light to said one end face of the semiconductor light amplifier, and
a focusing lens which focuses the light emanating from said one end face of the semiconductor light amplifier and images a light emission near field pattern of said one end face of the semiconductor light amplifier on the diffraction grating.

2. A semiconductor light emitting device as defined in claim 1 in which said diffraction grating is shaped to be selectively coupled with a particular transverse mode component of the light emanating from said one end face of the semiconductor light amplifier.

3. A semiconductor light emitting device as defined in claim 1 in which a mask which interrupts a part of the light emanating from said one end face of the semiconductor light amplifier and permits only a particular transverse mode component of the light to enter the diffraction grating is provided between the diffraction grating and the semiconductor light amplifier.

4. A semiconductor light emitting device as defined in claim 2 in which a mask which interrupts a part of the light emanating from said one end face of the semiconductor light amplifier and permits only a particular transverse mode component of the light to enter the diffraction grating is provided between the diffraction grating and the semiconductor light amplifier.

5. A semiconductor light emitting device as defined in claim 2, wherein said one end face of the semiconductor light amplifier includes a low reflectivity coating.

6. A semiconductor light emitting device as defined in claim 2, wherein a blaze angle of said diffraction grating is approximately 19.7°, and said diffraction grating has 830.8 lines/mm.

7. A semiconductor light emitting device as defined in claim 2, wherein the light emanating from the one end face of the semiconductor light amplifier has a wavelength within a wavelength band of 800 to 820 nm, and the light reflected by said diffraction grating has a single wavelength within the wavelength band.

8. A semiconductor light emitting device as defined in claim 7, wherein an output power of the device is greater than or equal to 0.5 W.

9. A semiconductor light emitting device as defined in claim 3, wherein the mask has a light transmissivity which is maximum in an area corresponding to a slit, and is gradually reduced outward from the slit.

* * * * *